(12) United States Patent
Yeh et al.

(10) Patent No.: US 8,423,819 B2
(45) Date of Patent: Apr. 16, 2013

(54) DATA STORAGE DEVICE, CONTROLLER, AND DATA ACCESS METHOD FOR A DOWNGRADE MEMORY

(75) Inventors: Kuo-Liang Yeh, Hsinchu County (TW); Ken-Fu Hsu, Hsinchu County (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 333 days.

(21) Appl. No.: 12/717,220

(22) Filed: Mar. 4, 2010

(65) Prior Publication Data

US 2011/0107141 A1 May 5, 2011

(30) Foreign Application Priority Data

Oct. 30, 2009 (TW) .............................. 98136853 A

(51) Int. Cl.
*G06F 11/26* (2006.01)
(52) U.S. Cl.
USPC ........................... 714/6.13; 714/6.1; 714/6.11
(58) Field of Classification Search .................. 714/6.13, 714/6.11, 6.1
See application file for complete search history.

(56) References Cited

U.S. PATENT DOCUMENTS

| | | | |
|---|---|---|---|
| 7,911,834 B2* | 3/2011 | Cornwell et al. ......... | 365/185.03 |
| 2004/0128468 A1* | 7/2004 | Lloyd-Jones ................. | 711/202 |
| 2004/0153743 A1* | 8/2004 | Bolt et al. ......................... | 714/7 |
| 2004/0153947 A1* | 8/2004 | Beer ............................. | 714/763 |
| 2006/0107156 A1* | 5/2006 | Lee et al. ....................... | 714/739 |
| 2006/0236163 A1* | 10/2006 | Hartmann ..................... | 714/718 |
| 2007/0201274 A1* | 8/2007 | Yu et al. .................... | 365/185.09 |
| 2007/0223277 A1* | 9/2007 | Tanaka et al. ............ | 365/185.09 |
| 2007/0263440 A1* | 11/2007 | Cornwell et al. ........ | 365/185.03 |
| 2008/0034159 A1* | 2/2008 | Kim .............................. | 711/115 |
| 2008/0201622 A1* | 8/2008 | Hiew et al. .................... | 714/718 |
| 2008/0209102 A1* | 8/2008 | Nakano ......................... | 711/100 |
| 2008/0288717 A1* | 11/2008 | Torabi ........................... | 711/103 |
| 2009/0137070 A1* | 5/2009 | Co et al. .......................... | 438/17 |
| 2010/0011173 A1* | 1/2010 | Kuo .............................. | 711/154 |
| 2010/0030944 A1* | 2/2010 | Hinz .............................. | 711/103 |

FOREIGN PATENT DOCUMENTS

| | | |
|---|---|---|
| TW | 200921691 | 5/2009 |
| TW | 200943306 | 10/2009 |

OTHER PUBLICATIONS

Taiwanese language office action dated Dec. 22, 2012.
English language translation of abstract of TW 200921691 (p. 4 of publication).
English language translation of abstract of TW 200943306 (p. 3 of publication).

* cited by examiner

*Primary Examiner* — Chae Ko
(74) *Attorney, Agent, or Firm* — McClure, Qualey & Rodack, LLP

(57) ABSTRACT

The invention provides a data storage device. In one embodiment, the data storage device is coupled to a host, and comprises a downgrade memory and a controller. The downgrade memory comprises a plurality of blocks, wherein each of the blocks comprises a plurality of pages, each of the pages comprises a plurality of sectors, and some of the sectors are defect sectors. The controller generates a defect table for recording a plurality of defect addresses of the defect sectors in the blocks, receives a plurality of data sectors to be written to the downgrade memory from the host, determines a plurality of first physical sector addresses for storing the data sectors according to the defect table, and sends write commands to the downgrade memory to direct the downgrade memory to write the data sectors to the downgrade memory according to the first physical sector addresses.

17 Claims, 8 Drawing Sheets

| Sector / Page | Sector 0 | Sector 1 | Sector 2 | Sector 3 |
|---|---|---|---|---|
| Page 0 | ○ | × | ○ | ○ |
| Page 1 | ○ | ○ | × | ○ |
| Page 2 | × | ○ | ○ | ○ |
| ...... | ...... | ...... | ...... | ...... |
| Page 127 | ○ | ○ | ○ | ○ |

FIG. 3

| 0x80 | CA1 | CA2 | RA1 | RA2 | RA3 |
|---|---|---|---|---|---|

| 0x85 | CA1sx | CA2sx | Dsx(512 + 16 Bytes) |
|---|---|---|---|

| 0x85 | CA1sy | CA2sy | Dsy(512 + 16 Bytes) |
|---|---|---|---|

| 0x85 | CA1sz | CA2sz | Dsz(512 + 16 Bytes) |
|---|---|---|---|

| 0x10 |
|---|

FIG. 5A

| 0x80 | CA1 | CA2 | RA1 | RA2 | RA3 | D (2K + 64 Bytes) | 0x10 |
|---|---|---|---|---|---|---|---|

FIG. 5B

| Logic sector address | Physical sector address |
|---|---|
| ⋮ | ⋮ |
| K | (X, 0, 0) |
| K+1 | (X, 0, 1) |
| K+2 | (X, 0, 3) |
| K+3 | (X, 1, 0) |
| K+4 | (X, 1, 3) |
| K+5 | (X, 2, 0) |
| ⋮ | ⋮ |

DATA STORAGE DEVICE, CONTROLLER, AND DATA ACCESS METHOD FOR A DOWNGRADE MEMORY

CROSS REFERENCE TO RELATED APPLICATIONS

This Application claims priority of Taiwan Patent Application No. 98136853, filed on Oct. 30, 2009, the entirety of which is incorporated by reference herein.

BACKGROUND OF THE INVENTION

1. Field of the Invention

The invention relates to data access of memories, and more particularly to data access of downgrade memories.

2. Description of the Related Art

Memories are divided into normal memories and downgrade memories. A memory comprises a plurality of memory cells for data storage. When a manufacturer produces a batch of memory chips, the manufacturer performs a quality test to determine the quality of the batch of memory chips. If the batch of memory chips cannot satisfy requirements of the quality test, the memory chips are then categorized into downgrade memory chips and sold in a price lower than that of normal memory chips. The low quality of the downgrade memory chips are due to defect memory cells of the downgrade memory chips. The defect memory cells cannot successfully store data, resulting in errors of data read from the downgrade memory chip.

Referring to FIG. 1A, a schematic diagram of block 150 of a downgrade memory is shown. The downgrade memory comprises a plurality of pages, each of the pages comprises a plurality of sectors, and each of the sectors comprises a plurality of memory cells for data storage. A sector 1 of a page 0 shown in FIG. 1A comprises a defect memory cell 161, a sector 2 of a page 1 shown in FIG. 1A comprises a defect memory cell 162, and a sector 0 of a page 2 shown in FIG. 1A comprises a defect memory cell 163. Because block 150 comprises a plurality of defect memory cells which cannot normally store data, a conventional controller of the downgrade memory marks block 150 as a defect block and does not use it to store data.

Block 150, however, comprises only three defect memory cells: 161, 162, and 163. Other memory cells of block 150 can still normally store data. Because the conventional controller directly avoids storing data in the entire block 150, the usable memory space of the downgrade memory is reduced, degrading the performance of the downgrade memory. Thus, a method for efficiently using downgrade memory to store data is required to increase the usable memory space of the downgrade memory.

BRIEF SUMMARY OF THE INVENTION

The invention provides a data storage device. In one embodiment, the data storage device is coupled to a host, and comprises a downgrade memory and a controller. The downgrade memory comprises a plurality of blocks, wherein each of the blocks comprises a plurality of pages, each of the pages comprises a plurality of sectors, and some of the sectors are defect sectors. The controller generates a defect table for recording a plurality of defect addresses of the defect sectors in the blocks, receives a plurality of data sectors to be written to the downgrade memory from the host, determines a plurality of first physical sector addresses for storing the data sectors according to the defect table, and sends write commands to the downgrade memory to direct the downgrade memory to write the data sectors to the downgrade memory according to the first physical sector addresses.

A data access method for a downgrade memory is provided. In one embodiment, the downgrade memory comprises a plurality of blocks, each of the blocks comprises a plurality of pages, each of the pages comprises a plurality of sectors, and some of the sectors are defect sectors. First, a defect table for recording a plurality of defect addresses of the defect sectors of the blocks is generated. A plurality of data sectors to be written to the downgrade memory is then received from a host. A plurality of first physical sector addresses for storing the data sectors is then determined according to the defect table. A plurality of write commands is then sent to the downgrade memory to direct the downgrade memory to write the data sectors to the downgrade memory according to the first physical sector addresses.

The invention further provides a controller. In one embodiment, the controller is coupled to a downgrade memory, wherein the downgrade memory comprises a plurality of blocks, each of the blocks comprises a plurality of pages, each of the pages comprises a plurality of sectors, and some of the sectors are defect sectors. In one embodiment, the controller comprises a control circuit and a memory. The control circuit generates a defect table for recording a plurality of defect addresses of the defect sectors in the blocks, receives a plurality of data sectors to be written to the downgrade memory from the host, determines a plurality of first physical sector addresses for storing the data sectors according to the defect table, and sends write commands to the downgrade memory to direct the downgrade memory to write the data sectors to the downgrade memory according to the first physical sector addresses. The memory stores the defect table.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 shows an embodiment of a defect table corresponding to the block shown in FIG. 1A according to the invention;

FIG. 5A shows an embodiment of a format of a random write command according to the invention;

FIG. 5B shows another embodiment of a format of a normal write command;

FIG. 7 shows an embodiment of an address link table according to the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
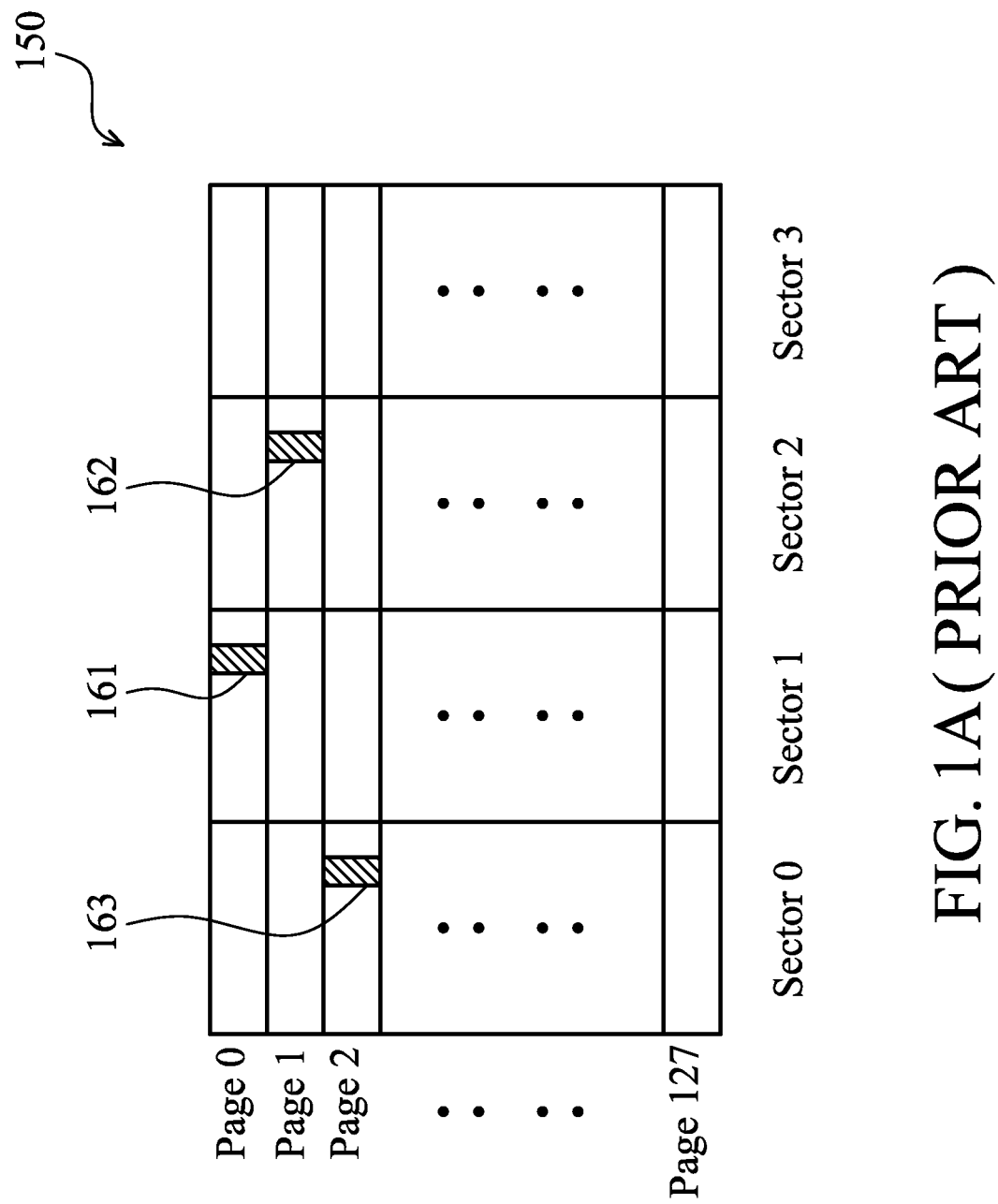
FIG. 1A is a schematic diagram of a block of a downgrade memory.
Figure 1B:
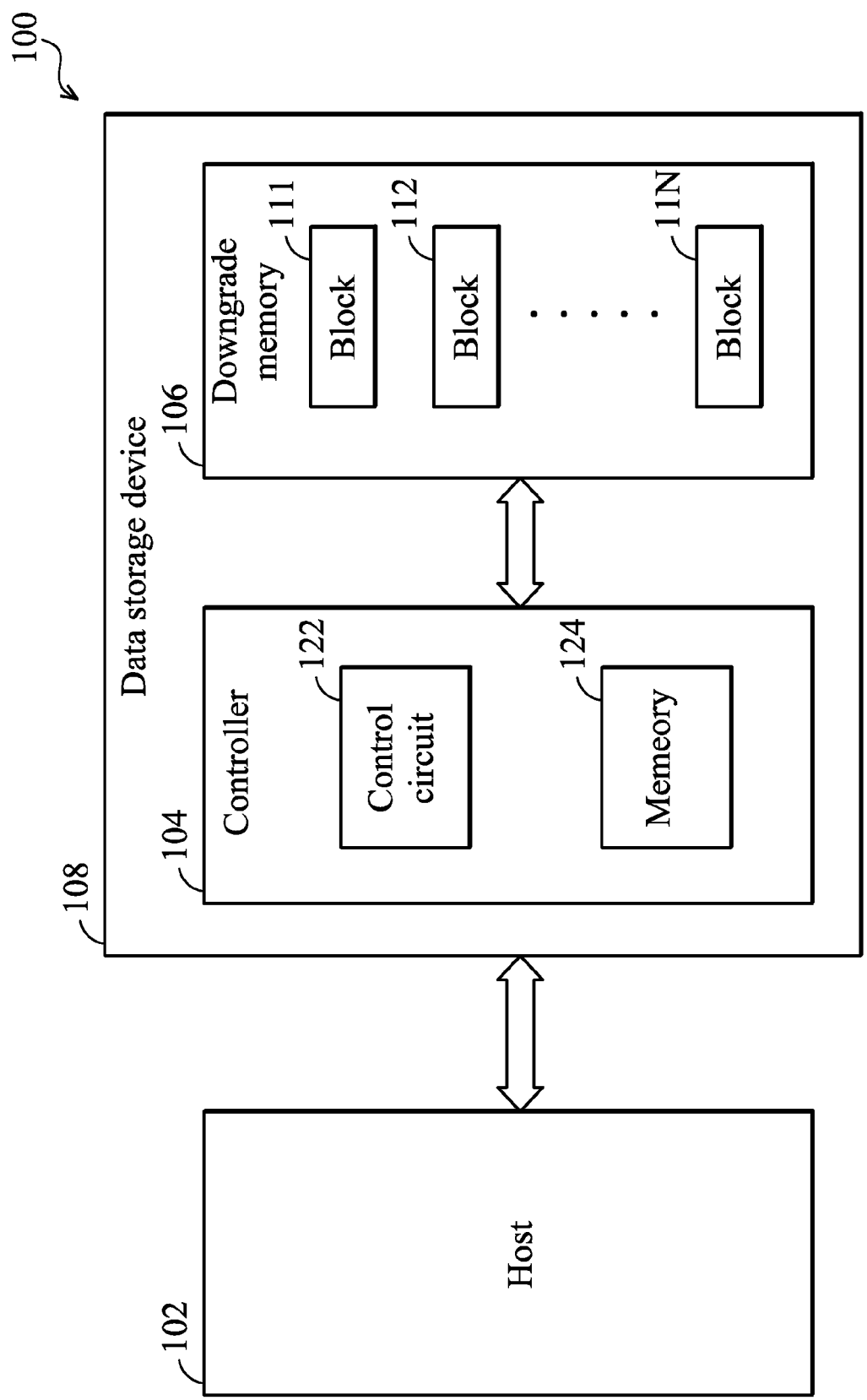
FIG. 1B is a block diagram of a data storage system according to the invention.

Referring to FIG. 1B, a block diagram of a data storage system 100 according to the invention is shown. The data storage system 100 comprises a host 102 and a data storage device 108. The data storage device 108 stores data for the host 102. In one embodiment, the data storage device 108 comprises a controller 104 and a downgrade memory 106. The downgrade memory 106 comprises a plurality of blocks 111~11N, each of the blocks comprises a plurality of pages, and each of the pages comprises a plurality of memory cells. Some blocks of the downgrade memory 106 comprises defect sectors comprising defect memory cells which cannot normally store data. In one embodiment, the downgrade memory 106 is a flash memory. The controller 104 is coupled to the host 102 and accesses data stored in the downgrade memory 106 according to instructions of the host 102. In one embodiment, the controller 104 comprises a control circuit 122 and a memory. 124. The control circuit 122 is a core circuit of the controller 104, and the memory 124 stores data for the control circuit 122.

In one embodiment, the controller 104 performs a test process on all blocks 111~11N of the downgrade memory to determine which sectors of the blocks comprise defect memory cells, and records the addresses of defect sectors in a defect table. In one embodiment, the defect table is stored in the memory 124. When the host 102 requests the controller 104 to write data to the downgrade memory 106, the controller 104 obtains a plurality of physical sector addresses of the downgrade memory 106, compares the physical sector addresses with the defect addresses stored in the defect table, and eliminates the defect addresses from the physical sector addresses. Thus, the physical sector addresses do not comprise defect addresses. When the controller 104 writes the data to the downgrade memory 106 according to the physical sector addresses, the data is not written to defect sectors of the downgrade memory 106, thus avoiding data storage errors. Because the controller 104 uses normal sectors rather than normal blocks of the downgrade memory 106 to store data, the usable memory space of the downgrade memory 106 is increased in comparison with that of a downgrade memory controlled by a conventional controller.

Figure 2:
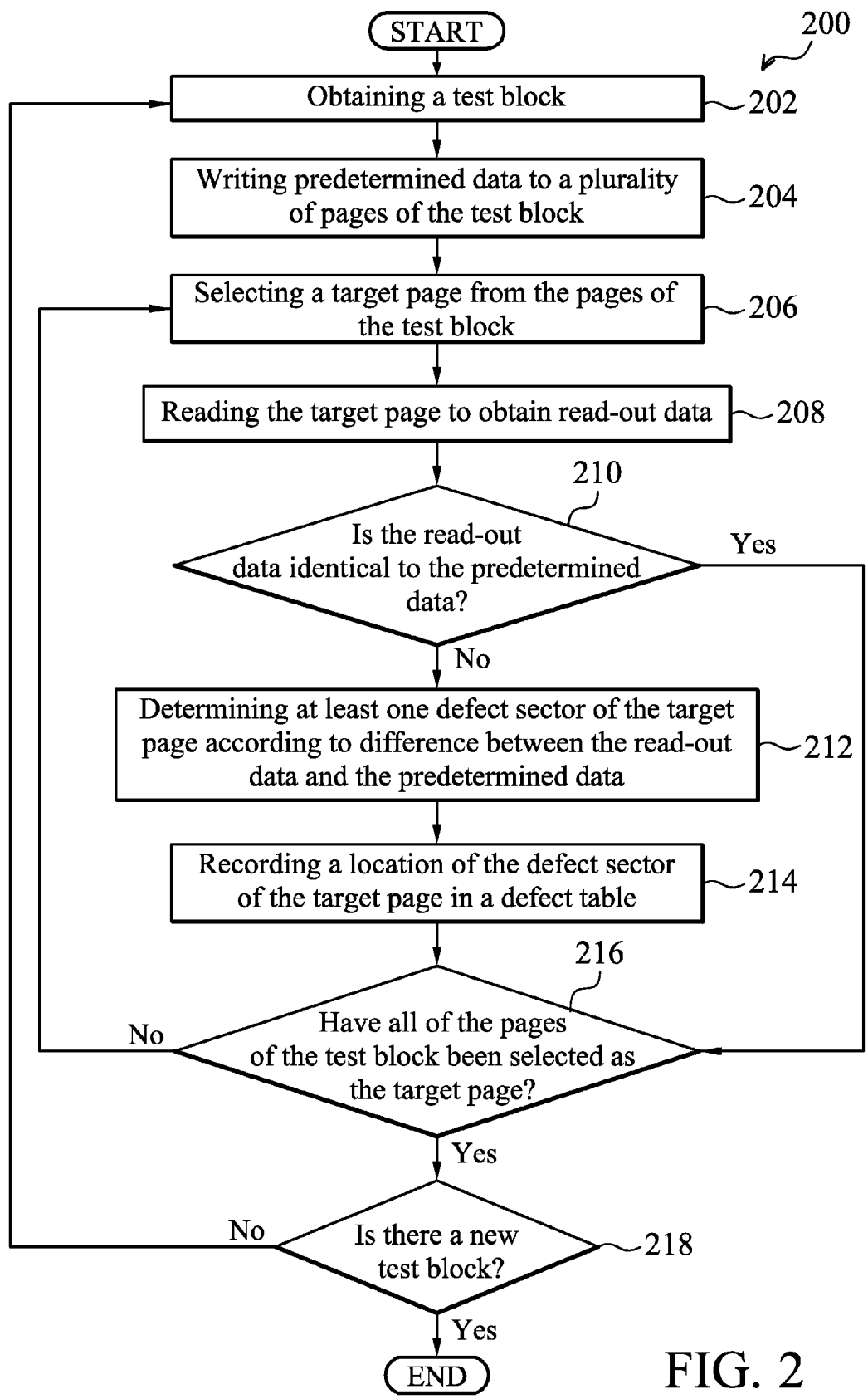
FIG. 2 is a flowchart of a method for generating a defect table according to the invention.

Referring to FIG. 2, a flowchart of a method 200 for generating a defect table according to the invention is shown. The controller 104 performs a test process on the blocks 111~11N of the downgrade memory 106 to generate a defect table. First, the controller 104 selects a test block from the blocks 111~11N of the downgrade memory 106 (step 202). The controller 104 then writes predetermined data to a plurality of pages of the test block (step 204). The controller 104 then selects a target page from the pages of the test block (step 206). The controller 104 then reads the target page to obtain read-out data (step 208). The controller 104 then compares the read-out data with the predetermined data to determine whether the read-out data is identical to the predetermined data (step 210).

If the read-out data is identical to the predetermined data, the target page does not comprise defect sectors which cannot normally store data. If the read-out data is different from the predetermined data, the target page comprises defect sectors which cannot normally store data. The controller 104 therefore determines defect sectors of the target page according to difference between the read-out data and the predetermined data (step 212), and then records defect addresses of the defect sectors of the target page in a defect table (step 214). If any of the pages of the test block have not been selected as the target page (step 216), the controller 104 selects a new target page from the pages of the test block (step 206), and performs steps 208~216. If all of the pages of the test block have been selected as the target page (step 216), the controller 104 selects a new test block from the blocks 111~11N of the downgrade memory 106 (step 202) and performs steps 204~216 until all of the blocks 111~11N have been selected as the test block (step 218).

Referring to FIG. 3, an embodiment of a defect table corresponding to block 150 shown in FIG. 1A according to the invention is shown. As shown in FIG. 1A, sector 1 of page 0 of block 150 comprises a defect memory cell 161, sector 2 of page 1 of block 150 comprises a defect memory cell 162, and sector 0 of page 2 of block 150 comprises a defect memory cell 163. When predetermined data is written to the defect memory cells 161, 162, and 163, the defect memory cells 161, 162, and 163 cannot normally store the predetermined data. When the defect memory cells 161, 162, and 163 are read to obtain read-out data, the read-out data is therefore different from the predetermined data. The controller 104 therefore determines that sector 1 of page 0, sector 2 of page 1, and the sector 0 of the page 2 are defect sectors, and records the addresses of the defect sectors in a defect table. When the controller 104 writes data to block 150, the controller 104 can therefore avoid writing data to the defect sectors.

Figure 4:
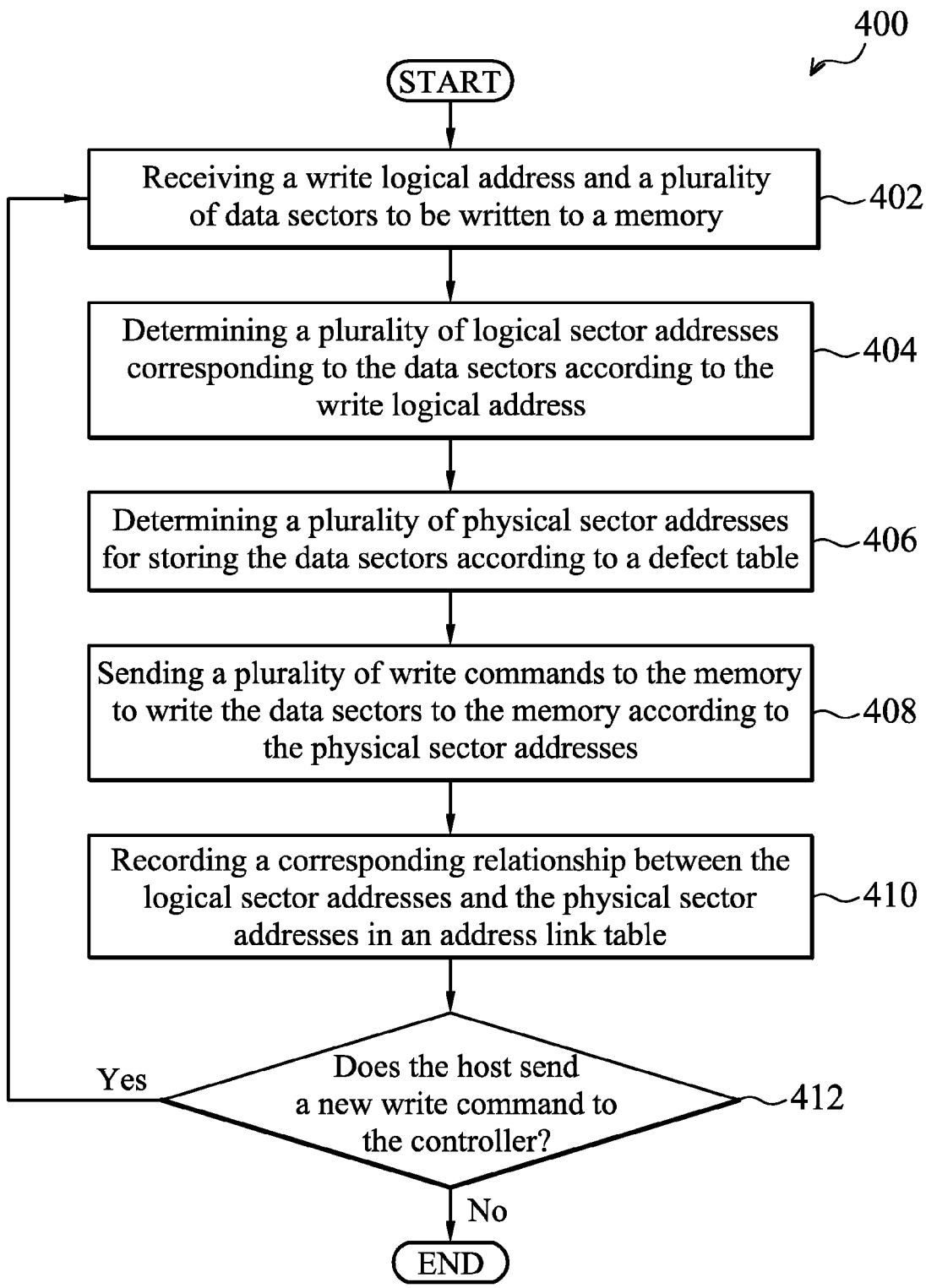
FIG. 4 is a flowchart of a method for writing data to a downgrade memory 106 according to the invention.

Referring to FIG. 4, a flowchart of a method 400 for writing data to a downgrade memory 106 according to the invention is shown. The controller 104 writes data to the downgrade memory 106 according to the method 400. First, the controller 104 receives a write logical address and a plurality of data sectors to be written to the downgrade memory 106 from the host 102 (step 402). The controller 104 then determines a plurality of logical sector addresses corresponding to the data sectors according to the write logical address (step 404). The controller 104 then determines a plurality of physical sector addresses for storing the data sectors according to a defect table (step 406). In one embodiment, the controller 104 obtains a plurality of physical sector addresses of the downgrade memory, compares the physical sector addresses with defect addresses according to the defect table, and eliminates defect addresses from the physical sector addresses to obtain physical sector addresses for storing the data sectors. Thus, the data sectors are not stored according to the defect sector addresses recorded in the defect table to avoid data storage errors.

The controller 104 then sends a plurality of write commands to the downgrade memory 106 to write the data sectors to the downgrade memory 106 according to the physical sector addresses (step 408). In one embodiment, the write commands sent by the controller 104 are random write commands and have hexadecimal values of 0x80 to direct the downgrade memory 106 to store the data sectors. The controller 104 then records a corresponding relationship between the logical sector addresses of the data sectors and the physical sector addresses for storing the data sectors in an address link table (step 410). The address link table is subsequently illustrated with FIG. 7. Finally, if the host 102 continues to send a new write command to the controller 104, the controller 104 receives a new write logical address and a plurality of new data sectors from the host 102 (step 402), and performs steps 404~410 to write the new data sectors to the downgrade memory 106.

Referring to FIG. 5A, an embodiment of a format of a random write command according to the invention is shown. Assume that the controller 104 wants to write three data sectors to three sectors SX, SY, and SZ of a target page, wherein the target page has a column address CA1 and CA2, and the target page has a row address of RA1, RA2, and RA3. Each of the data sectors has a data length of 512+16 bytes. The column addresses of the three data sectors are respectively $CA1_{SX}$ and $CA2_{SX}$, $CA1_{SY}$ and $CA2_{SY}$, $CA1_{SZ}$ and $CA2_{SZ}$. First, the controller 104 sends a write command with a value of 0x80, a column address CA1 and CA2, and a row address RA1, RA2, and RA3 to the downgrade memory 106. The controller 104 then sequentially sends a random write command with a value of 0x85, a column address $CA1_{SX}$ and $CA2_{SX}$ of a sector SX, and a first data sector $D_{SX}$ to the downgrade memory 106, thus directing the downgrade memory 106 to write the first data sector $D_{SX}$ to the sector SX.

The controller 104 then sequentially sends a random write command with a value of 0x85, a column address $CA1_{SY}$ and $CA2_{SY}$ of a sector SY, and a second data sector $D_{SY}$ to the downgrade memory 106, thus directing the downgrade memory 106 to write the second data sector $D_{SY}$ to the sector SY. The controller 104 then sequentially sends a random write command with a value of 0x85, a column address $CA1_{SZ}$ and $CA2_{SZ}$ of a sector SZ, and a third data sector $D_{SZ}$ to the downgrade memory 106, thus directing the downgrade memory 106 to write the third data sector $D_{SZ}$ to the sector SZ. Finally, the controller 104 sends a program command with a value of 0x10 to the downgrade memory 106. Referring to FIG. 5B, another embodiment of a format of a normal write command is shown. A controller sequentially sends a write command with a value of 0x80, a column address CA1 and CA2 of a target page, a row address RA1, RA2, and RA3 of the target page, data D, and a program command with a value of 0x10 to a memory, thus directing the memory to write the data D to the target page. The format of the normal write command shown in FIG. 5B is significantly different from that of the random write command shown in FIG. 5A.

Figure 6:
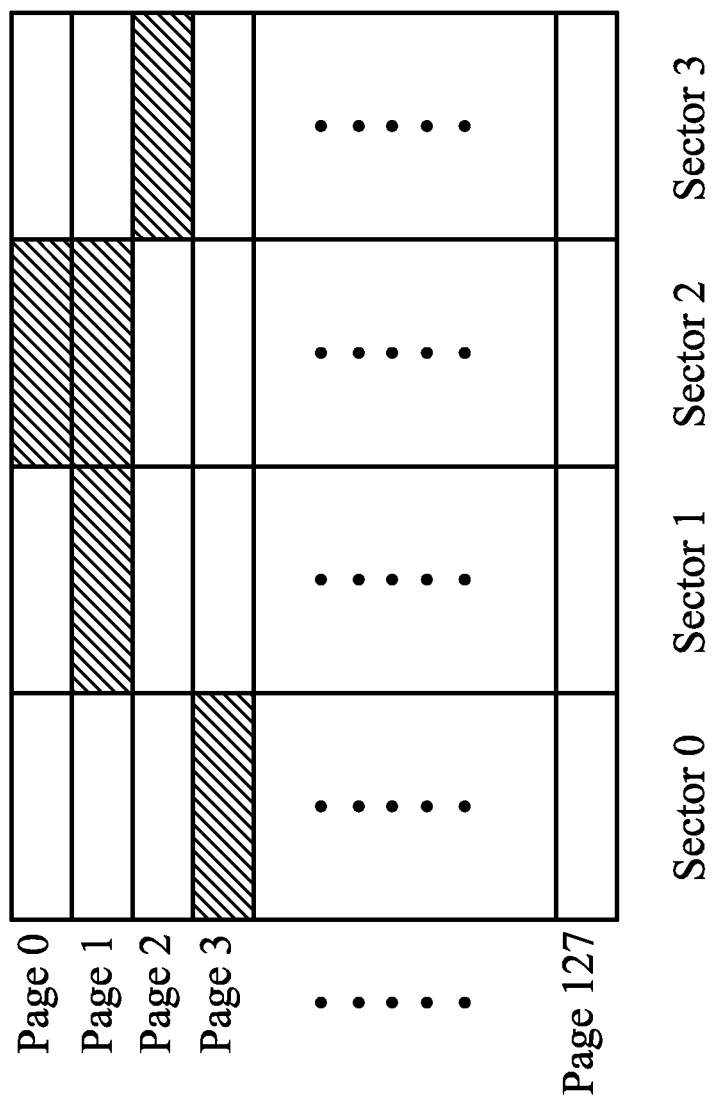
FIG. 6 is an embodiment of a block of a downgrade memory.

Referring to FIG. 6, an embodiment of block X of a downgrade memory 106 is shown. Assume that sector 2 of page 0, sectors 1 and 2 of page 1, sector 3 of page 2, and sector 0 of page 3 of block X are defect sectors. Assume that the controller 104 receives six data sectors D1, D2, D3, D4, D5, and D6 with logical addresses K, K+1, K+2, K+3, K+4, and K+5 to be written to the block X of the downgrade memory 106. The controller 106 therefore selects sectors 0, 1, and 3 of page 0, sectors 1 and 3 of page 1, and sector 0 of page 2 from block X for storing the six data sectors D1, D2, D3, D4, D5, and D6. The controller 106 therefore sequentially sends a write command 0x80, a physical address of page 0, a random write command 0x85, a physical sector address of sector 0 of page 0, a first data sector D1, a random write command 0x85, a physical sector address of sector 1 of page 0, a second data sector D2, a random write command 0x85, a physical sector address of sector 3 of page 0, a third data sector D3, and a program command 0x10 to the downgrade memory 106, thus directing the downgrade memory 106 to write the data sectors D1, D2, and D3 to sectors 0, 1, and 3 of the page 0 of block X.

The controller 106 then sequentially sends a write command 0x80, a physical address of page 1, a random write command 0x85, a physical sector address of sector 0 of page 1, a fourth data sector D4, a random write command 0x85, a physical sector address of sector 3 of page 1, a fifth data sector D5, and a program command 0x10 to the downgrade memory 106, thus directing the downgrade memory 106 to write the data sectors D4, and D5 to the sectors 0 and 3 of page 1 of block X. The controller 106 then sequentially sends a write command 0x80, a physical address of page 2, a random write command 0x85, a physical sector address of sector 0 of page 2, a sixth data sector D6, and a program command 0x10 to the downgrade memory 106, thus directing the downgrade memory 106 to write the data sector D6 to sector 0 of page 2 of block X. Finally, the controller 104 records a corresponding relationship between the logical sector addresses and the physical sector addresses of the data sectors D1, D2, D3, D4, D5, and D6 in an address link table.

Referring to FIG. 7, an embodiment of an address link, table 700, according to the invention is shown. The address link table 700 records the corresponding relationship between the logical sector addresses and the physical sector addresses of the data sectors D1, D2, D3, D4, D5, and D6 in the embodiment of FIG. 6. The address link table 700 therefore records the logical sector address K of the data sector D1 in correspondence to the physical sector address of sector 0 of page 0 of block X, the logical sector address K+1 of the data sector D2 in correspondence to the physical sector address of sector 1 of page 0 of block X, and the logical sector address K+5 of the data sector D6 in correspondence to the physical sector address of sector 0 of page 2 of block X. After the controller 104 records the corresponding relationship in the address link table 700, when the host 102 sends a read logical address to the controller 104, the controller 104 can then determines a plurality of read physical sector addresses corresponding to the read logical address according to the address link table 700, and send a plurality of read commands to the downgrade memory 106 to direct the downgrade memory 106 to read data stored according to the read physical sector addresses.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, coupled to a host, comprising:
   a downgrade memory, comprising a plurality of blocks, wherein each of the blocks comprises a plurality of pages, and each of the pages comprises a plurality of sectors, wherein some of the sectors are defect sectors; and
   a controller, generating a defect table for recording a plurality of defect addresses of the defect sectors in the blocks, receiving a plurality of data sectors to be written to the downgrade memory from the host, determining a plurality of first physical sector addresses for storing the data sectors according to the defect table, and sending write commands to the downgrade memory to direct the downgrade memory to write the data sectors according to the first physical sector addresses;
   wherein the write commands respectively comprise an identifier of the write command, a physical page address of a target page, a series of random write commands and physical sector addresses of the target page to be written with the data sectors, and a program command, and
   wherein the identifier of the write command is different from a hex-decimal value representing the random write commands.

2. The data storage device as claimed in claim 1, wherein the controller obtains a plurality of second physical sector addresses of the downgrade memory, compares the second physical sector addresses with defect addresses according to the defect table, and eliminates defect addresses from the second physical sector addresses to obtain the first physical sector addresses.

3. The data storage device as claimed in claim 1, wherein the controller selects a test block from the blocks of the downgrade memory, writes predetermined data to the test block, reads the test block to obtain read-out data, compares the read-out data with the predetermined data, determines the defect addresses of the defect sectors according to differences between the read-out data and the predetermined data, records the defect addresses in the defect table, and repeats selecting of the test block, writing of the predetermined data to the test block, reading and comparing of the read-out data, and determining and recording of the defect addresses until all of the blocks of the downgrade memory have been selected as the test block.

4. The data storage device as claimed in claim 1, wherein the controller receives a write logical address from the host, determines a plurality of logical sector addresses corresponding to the data sectors according to the write logical address, and records a corresponding relationship between the logical sector addresses and the first physical sector addresses in an address link table after the data sectors are written to the downgrade memory according to the first physical sector addresses.

5. The data storage device as claimed in claim 4, wherein when the controller receives a read logical address from the host, the controller determines a plurality of read physical sector addresses corresponding to the read logical address according to the address link table, and send a plurality of read commands to the downgrade memory to direct the downgrade memory to read data stored according to the read physical sector addresses.

6. The data storage device as claimed in claim 1, wherein the downgrade memory is a flash memory.

7. A data access method for a downgrade memory, wherein the downgrade memory comprises a plurality of blocks, each of the blocks comprises a plurality of pages, each of the pages comprises a plurality of sectors, and some of the sectors are defect sectors, the method comprising
generating a defect table for recording a plurality of defect addresses of the defect sectors of the blocks;
receiving a plurality of data sectors to be written to the downgrade memory from a host;
determining a plurality of first physical sector addresses for storing the data sectors according to the defect table; and
sending write commands to the downgrade memory to direct the downgrade memory to write the data sectors according to the first physical sector addresses;
wherein the write commands respectively comprise an identifier of the write command, a physical page address of a target page, a series of random write commands and physical sector addresses of the target page to be written with the data sectors, and a program command, and
wherein the identifier of the write command is different from a hex-decimal value representing the random write commands.

8. The data access method as claimed in claim 7, wherein determining the first physical sector addresses comprises:
obtaining a plurality of second physical sector addresses of the downgrade memory;
comparing the second physical sector addresses with defect addresses according to the defect table; and
eliminating defect addresses from the second physical sector addresses to obtain the first physical sector addresses.

9. The data access method as claimed in claim 7, wherein generating of the defect table comprises:
selecting a test block from the blocks of the downgrade memory;
writing predetermined data to the test block;
reading the test block to obtain read-out data;
comparing the read-out data with the predetermined data;
determining the defect addresses of the defect sectors according to differences between the read-out data and the predetermined data;
recording the defect addresses in the defect table; and
repeating the steps from the selection of the test block to determine and record the defect addresses until all of the blocks of the downgrade memory have been selected as the test block.

10. The data access method as claimed in claim 7, wherein the data access method further comprises:
receiving a write logical address from the host;
determining a plurality of logical sector addresses corresponding to the data sectors according to the write logical address; and
recording a corresponding relationship between the logical sector addresses and the first physical sector addresses in an address link table after the data sectors are written to the downgrade memory according to the first physical sector addresses.

11. The data access method as claimed in claim 10, wherein the data access method further comprises:
when receiving a read logical address from the host, determining a plurality of read physical sector addresses corresponding to the read logical address according to the address link table; and
sending a plurality of read commands to the downgrade memory to direct the downgrade memory to read data stored according to the read physical sector addresses.

12. The data access method as claimed in claim 7, wherein the downgrade memory is a flash memory.

13. A controller, coupled to a downgrade memory, wherein the downgrade memory comprises a plurality of blocks, each of the blocks comprises a plurality of pages, each of the pages comprises a plurality of sectors, and some of the sectors are defect sectors, the controller comprising:
a control circuit, generating a defect table for recording a plurality of defect addresses of the defect sectors in the blocks, receiving a plurality of data sectors to be written to the downgrade memory from a host, determining a plurality of first physical sector addresses for storing the data sectors according to the defect table, and sending write commands to the downgrade memory to direct the downgrade memory to write the data sectors according to the first physical sector addresses; and
a memory, coupled to the control circuit, storing the defect table;
wherein the write commands respectively comprise an identifier of the write command, a physical page address of a target page, a series of random write commands and physical sector addresses of the target page to be written with the data sectors, and a program command, and
wherein the identifier of the write command is different from a hex-decimal value representing the random write commands.

14. The controller as claimed in claim 13, wherein the control circuit obtains a plurality of second physical sector addresses of the downgrade memory, compares the second physical sector addresses with defect addresses according to the defect table, and eliminates defect addresses from the second physical sector addresses to obtain the first physical sector addresses.

15. The controller as claimed in claim 13, wherein the control circuit selects a test block from the blocks of the downgrade memory, writes predetermined data to the test block, read the test block to obtain read-out data, compares the read-out data with the predetermined data, determines the defect addresses of the defect sectors according to differences between the read-out data and the predetermined data, records the defect addresses in the defect table, and repeats selecting of the test block, writing of the predetermined data to the test block, reading and comparing of the read-out data, and determining and recording of the defect addresses until all of the blocks of the downgrade memory have been selected as the test block.

16. The controller as claimed in claim 13, wherein the control circuit receives a write logical address from the host, determines a plurality of logical sector addresses corresponding to the data sectors according to the write logical address, and records a corresponding relationship between the logical sector addresses and the first physical sector addresses in an address link table after the data sectors are written to the downgrade memory according to the first physical sector addresses.

17. The controller as claimed in claim 16, wherein when the control circuit receives a read logical address from the host, the control circuit determines a plurality of read physical sector addresses corresponding to the read logical address according to the address link table, and send a plurality of read commands to the downgrade memory to direct the downgrade memory to read data stored according to the read physical sector addresses.

* * * * *